(12) United States Patent
Pendharkar et al.

(10) Patent No.: US 9,786,665 B1
(45) Date of Patent: Oct. 10, 2017

(54) DUAL DEEP TRENCHES FOR HIGH VOLTAGE ISOLATION

(71) Applicant: Texas Instruments Incorporated, Dallas, TX (US)

(72) Inventors: Sameer Pendharkar, Allen, TX (US); Binghua Hu, Plano, TX (US); Alexei Sadovnikov, Sunnyvale, CA (US); Guru Mathur, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/238,198

(22) Filed: Aug. 16, 2016

(51) Int. Cl.
*H01L 27/092* (2006.01)
*H01L 29/06* (2006.01)
*H01L 21/8238* (2006.01)

(52) U.S. Cl.
CPC .. *H01L 27/0922* (2013.01); *H01L 21/823871* (2013.01); *H01L 21/823878* (2013.01); *H01L 21/823892* (2013.01); *H01L 29/0615* (2013.01); *H01L 29/0649* (2013.01)

(58) Field of Classification Search
CPC ......... H01L 27/0922; H01L 21/823871; H01L 29/0649; H01L 21/823892; H01L 21/823878; H01L 29/0615
See application file for complete search history.

(56) References Cited

U.S. PATENT DOCUMENTS 9,159,791 B2 * 10/2015 Chen ................. H01L 29/41766

* cited by examiner

*Primary Examiner* — Roy Potter
*Assistant Examiner* — Paul Patton
(74) *Attorney, Agent, or Firm* — Tuenlap D. Chan; Charles A. Brill; Frank D. Cimino

(57) ABSTRACT

A semiconductor device adopts an isolation scheme to protect low voltage transistors from high voltage operations. The semiconductor device includes a substrate, a buried layer, a transistor well region, a first trench, and a second trench. The substrate has a top surface and a bottom surface. The buried layer is positioned within the substrate, and the transistor well region is positioned above the buried layer. The first trench extends from the top surface to penetrate the buried layer, and the first trench has a first trench depth. The second trench extending from the top surface to penetrate the buried layer. The second trench is interposed between the first trench and the transistor well region. The second trench has a second trench depth that is less than the first trench depth.

23 Claims, 11 Drawing Sheets

DUAL DEEP TRENCHES FOR HIGH VOLTAGE ISOLATION

BACKGROUND

Integrated circuits with high voltage capabilities have wide industrial applications, including power management systems for use in automobiles. These integrated circuits include high voltage transistors that operate at a high voltage range (e.g., 80 v to 120 v) and low voltage transistors that operate at a much lower voltage range (e.g., 1 v to 5 v). To protect the low voltage transistors from the high voltage operations, an integrated circuit may adopt one or more isolation schemes. For instance, one scheme involves forming a buried layer (e.g., an N-type buried layer) on top of a bulk substrate (e.g., a P-type substrate) to isolate the high voltage transistors from the low voltage transistors. The buried layer is typically biased at a high voltage corresponding to the operating range of the high voltage transistors, whereas the bulk substrate is typically biased at a ground supply voltage. In some cases, the difference between the high bias voltage and the ground supply voltage may exceed a breakdown voltage threshold of a PN junction between the buried layer and the bulk substrate, thereby causing leakages and impacting the performance and reliability of the integrated circuit.

SUMMARY

The present disclosure describes systems and techniques relating to the manufacturing of a semiconductor device that can handle high voltage operations alongside with low voltage operations. The semiconductor device may be a standalone discrete component or incorporated as a part of an integrated circuit. The semiconductor device adopts an isolation scheme to protect low voltage transistors from high voltage operations. The disclosed isolation scheme allows the high voltage transistors to operate at a high voltage range while reducing the voltage stress between a buried layer and a bulk substrate of the semiconductor device. Advantageously, the disclosed isolation scheme provides a low-cost and high-performance solution to alleviate junction breakdowns of the semiconductor device.

In one aspect, for example, the present disclosure introduces an integrated circuit that includes a substrate, a buried layer, a transistor well region, a first trench, and a second trench. The substrate has a top surface and a bottom surface. The buried layer is positioned within the substrate, and the transistor well region is positioned above the buried layer. The first trench extends from the top surface to penetrate the buried layer, and the first trench has a first trench depth. The second trench extending from the top surface to penetrate the buried layer. The second trench is interposed between the first trench and the transistor well region. The second trench has a second trench depth that is less than the first trench depth.

More specifically, the substrate has a first conductivity type, and the buried layer has a second conductivity type opposite of the first conductivity type. The first trench may include a first conductor that is insulated from the buried layer and making an ohmic contact with the substrate around a bottom portion of the first trench, whereas the second trench may include a second conductor insulated from the buried layer and the substrate.

In another aspect, the present disclosure introduced a method for manufacturing a semiconductor device. The disclosed method includes forming a buried layer within a substrate. The disclosed method also includes forming a transistor well region above the buried layer. The disclosed method further includes forming a first trench extending from a top surface of the substrate to penetrate the buried layer, and forming a second trench extending from the top surface of the substrate to penetrate the buried layer. More specifically, the second trench is interposed between the first trench and the transistor well region, and the second trench has a trench depth less than that of the first trench.

DRAWING DESCRIPTIONS

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

Figure 1A:
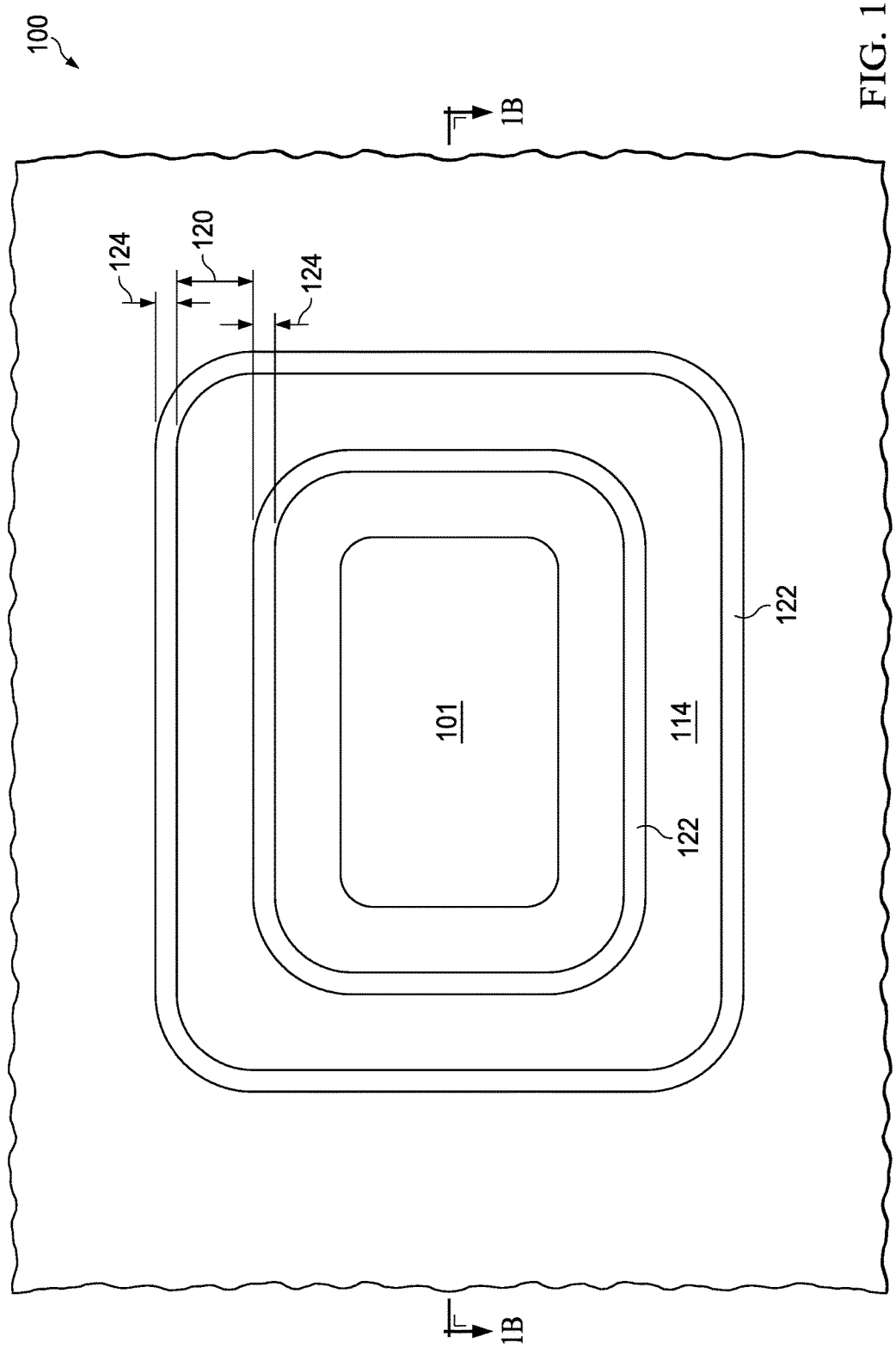
FIG. 1A shows a top view of a semiconductor device according to an aspect of the present disclosure.
Figure 1B:
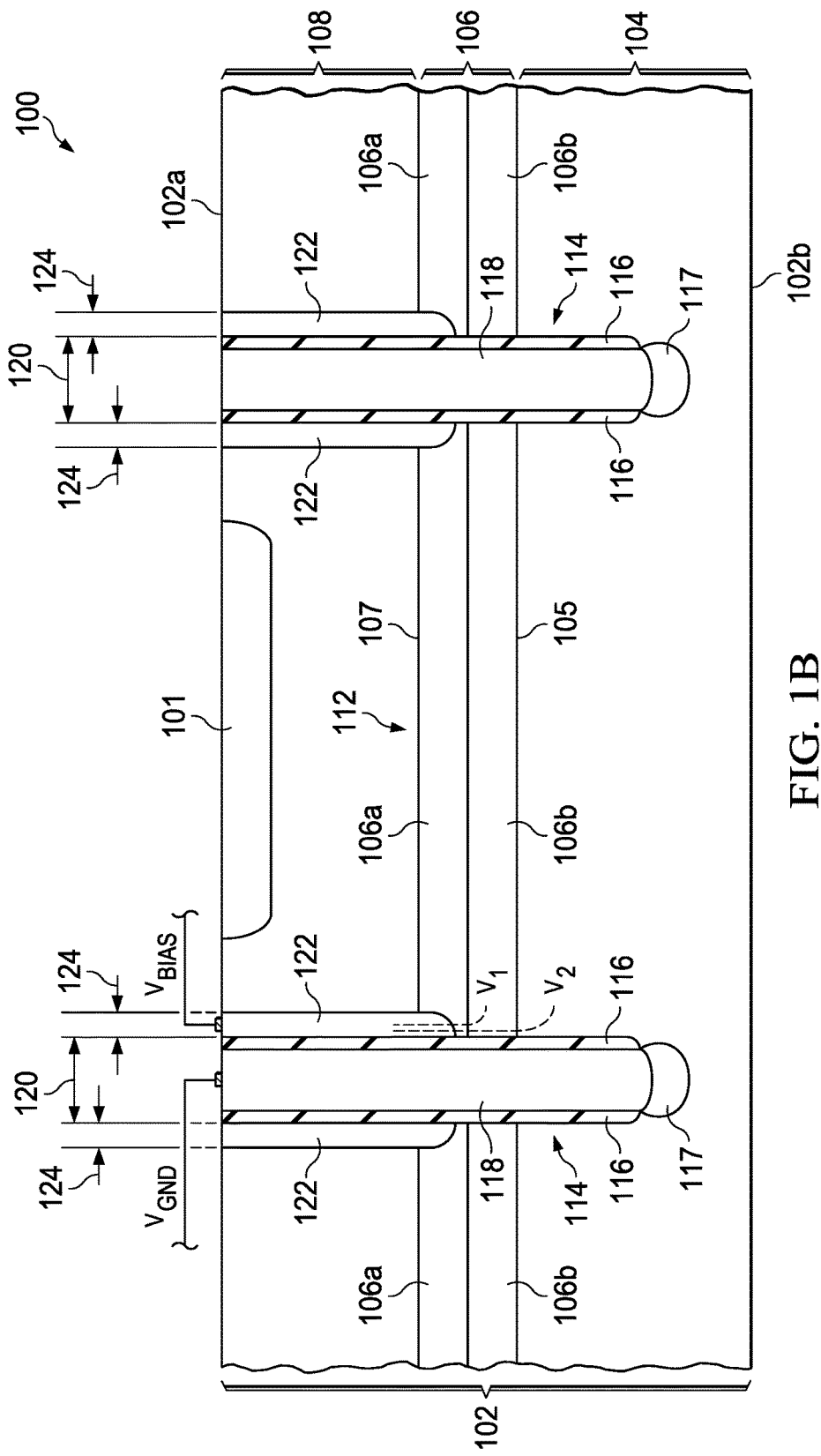
FIG. 1B shows a cross-sectional view of the semiconductor device according to an aspect of the present disclosure.

FIG. 1A shows a top view of a semiconductor device 100, and FIG. 1B shows a cross-sectional view of the semiconductor device 100 to illustrate its vertical structure. The semiconductor device 100 includes a substrate 102, which can be subdivided into a lower semiconductor layer 104 and an upper semiconductor layer 108. The lower semiconductor layer 104 forms a bottom surface 102b of the substrate 102, whereas the upper semiconductor layer 108 forms a top surface 102a of the substrate 102. The lower semiconductor layer 104 may be, for example, a part of a bulk silicon substrate (e.g., 102), an epitaxial layer on a bulk silicon wafer, or a silicon-on-insulator (SOI) wafer. The upper semiconductor layer 108 may be an epitaxial layer formed above the lower semiconductor layer 102, or as an extension of a bulk silicon substrate (e.g., 102). The lower and upper semiconductor layer 104 and 108 typically have the same conductivity type (e.g., P-type).

The semiconductor device 100 includes a buried layer 106 positioned within the substrate 102. The buried layer 106 may be developed by doping the lower semiconductor layer 104. Alternatively, the buried layer 106 may be formed by growing an epitaxial layer with in situ doping on top of the lower semiconductor layer 104. The buried layer 106 is interposed between the lower and upper semiconductor layers 104 and 108, and the buried layer 106 has the opposite conductivity type from these two layers 104 and 108. As such, the buried layer 106 forms a first PN junction 105 with the lower semiconductor layer 104 and a second PN junction 107 with the upper semiconductor layer 108. The buried layer 106 may have an average doping density of at least $1\times10^{18}$ cm-3 and commonly has an opposite conductivity type from the lower semiconductor layer 104. A top boundary 112 of the buried layer 106 is at least 2 microns below the top surface 102a of the substrate 102, and may extend 5 microns to 10 microns below the top surface 102a of the substrate 102. The buried layer 106 may extend laterally across the semiconductor device 100 as depicted in FIG. 1, or alternatively, the buried layer may be developed or formed within a finite lateral region that is coplanar with the substrate 102.

The semiconductor device 100 includes a transistor well region 101 that is positioned within the upper semiconductor layer 108 and above the buried layer 106. The transistor well region 101 includes transistors for forming one or more active circuits. In the event that the transistor well region 101 includes a low voltage circuit (e.g., a circuit that operates with less than 10 v), the transistor well region 101 is isolated and protected from a high voltage circuit (e.g., a circuit that operates with more than 50 v) formed outside of the transistor well region 101. Alternatively, in the event that the transistor well region 101 includes a high voltage circuit, the transistor well region 101 is isolated to protect a low voltage circuit formed outside of the transistor well region 101.

To isolate the high voltage circuit from the low voltage circuit, the semiconductor device 100 includes one or more deep trench structures 114 arranged to laterally surround the transistor well region 101 and intersect the buried layer 106. More specifically, the deep trench structure 114 extends from the top surface 102a to penetrate through the buried layer 106, thereby reaching the lower semiconductor layer 104. The deep trench structure 114 may have a trench width 120 of less than 6 um. In one implementation, for example, the trench width 120 may range from 1 micron to 4 microns. The deep trench structure 114 includes dielectric liners 116 disposed along the interior sidewalls. The dielectric liners 116 may include thermal silicon dioxide. The deep trench structure 114 defines a bottom opening for accessing the lower semiconductor layer 104 of the substrate 102. The access point is doped with a dopant of the same conductivity type as the lower semiconductor layer 104 to form a doped region 117. In one implementation, the doped region 117 may have a higher doping concentration than the lower semiconductor layer 104.

The deep trench structure 114 includes trench fill material 118 disposed onto the dielectric liners 116. The trench fill material 118 is conductive, and it is insulated from the upper semiconductor layer 108 and the buried layer 106. In one implementation, for example, the trench fill material 118 includes polycrystalline silicon, which is commonly referred to as polysilicon. The trench fill material (i.e., trench conductor) 118 establishes an ohmic contact with the lower semiconductor layer 104 of the substrate 102 via the bottom opening and the doped region 117. Through this ohmic contact, the trench conductor 118 can be used for biasing the lower semiconductor layer 104 of the substrate 102. In one implementation, for example, the trench conductor 118 may be structured to receive a ground supply voltage $V_{GND}$ to bias the lower semiconductor layer 104 of the substrate 102.

When being biased at a voltage $V_{BIAS}$ corresponding to the operation voltage range of the high voltage circuit, the buried layer 106 can be used as an isolation structure as well. For instance, where the operation voltage range of the high voltage circuit is between 80 v and 100 v, the bias voltage $V_{BIAS}$ of the buried layer 106 may range from 100 v to 170 v. To bias the buried layer 106, the semiconductor device 100 includes vertical doped structures (a.k.a. sinkers) 122 that extend from the top surface 102a to reach the buried layer 106. The sinkers 122 are doped with dopants of the same conductivity type as the buried layer 106 so as to provide electrical connections to the buried layer 106. In one implementation, for example, the sinkers 122 are doped with N-type materials where the buried layer 106 is N-doped as well.

For self-alignment purposes, the sinkers 122 may be formed alongside the deep trench structure 114. The sinkers 122 extend laterally from the deep trench structure 114 to have a thickness 124, and the sinkers 122 coextend with the deep trench structure 114 to provide a conductive path between the top surface 102a and the buried layer 106. In one implementation, the thickness 124 of the sinkers is less than 2.5 microns, which may advantageously reduce the size of the semiconductor device 100 when compared to semiconductor devices without self-alignment sinkers.

As shown in FIG. 1A, the trench structure 114 and the sinkers 122 form a contiguous ring that circumscribes the transistor well region 101. In an alternative implementation, the trench structure 114 and the sinkers 122 may be arranged as disconnected and discrete segments to approximate the contiguous ring for isolating the transistor well region 101.

During operations, the upper semiconductor layer 108 may incur a relatively high voltage where the transistor well region 101 includes one or more high voltage circuits. For example, the upper semiconductor layer 108 may incur a voltage ranges from 80 v to 100 v. To prevent a current from crossing the second PN junction 107 (e.g., due to a forward bias), the buried layer 106 is biased with a voltage $V_{BIAS}$ that is higher than the voltage incurred by the upper semiconductor layer 108. In one implementation, for example, the bias voltage $V_{BIAS}$ may range from 100 v to 170 v. In another implementation, for example, the bias voltage $V_{BIAS}$ may range from 140 v to 170 v. In yet another implementation, for example, the bias voltage $V_{BIAS}$ may range from 145 v to 155v.

When the lower semiconductor layer 104 is biased at a ground supply voltage $V_{GND}$, the potential difference between the buried layer 106 and the lower semiconductor layer 104 can become significantly large. And when this potential difference becomes larger than the breakdown voltage (e.g., less than 80 v) of the first PN junction 105, the semiconductor device 100 may experience a substantial amount of current leakage. This potential difference can be illustrated by an electric field density spread across a high electric field line $V_1$ and a low electric field line $V_2$. In general, the high electric field line $V_1$ represents a potential distribution closer to the bias voltage $V_{BIAS}$, and the low electric field line $V_2$ represents a potential distribution closer to the ground supply voltage $V_{GND}$. The likelihood of having a breakdown at the first PN junction 105 is directly proportional to the potential difference between $V_1$ and $V_2$, and inversely proportional to a distance between $V_1$ and $V_2$.

According to an aspect of the present disclosure, thickening the dielectric liner 116 may help increase the low electric field line $V_2$ as the ground potential carried by the trench conductor 118 exerts less capacitive coupling to the adjacent P-region of the lower semiconductor layer 104. By increasing the low electric field line $V_2$, the potential difference between $V_1$ and $V_2$ can be reduced to lower the likelihood of having a breakdown along the first PN junction 105. This approach may be less effective where $V_1$ is substantially higher than $V_2$ (e.g., $V_1-V_2 \geq 100$ v) and the maximum thickness of the dielectric liner 116 is limited by one or more process parameters.

According to another aspect of the present disclosure, increasing the thickness of the buried layer 106 (e.g., thickness of the buried layer≥12 μm) may help reduce the electric field density between $V_1$ and $V_2$ to avoid electric field crowding along the first PN junction 105. By reducing the electric field density, the potential gradient at the first PN junction 105 can be reduced to lower the likelihood of having a breakdown along the first PN junction 105. This approach may be costly where $V_1$ is substantially higher than $V_2$ (e.g., $V_1$-$V_2$≥100 v) because a thickened buried layer 106 typically requires more material and time to develop, and it can be more difficult to etch in forming the deep trench structure 114.

According to yet another aspect of the present disclosure, the buried layer 106 may include an upper buried layer 106a with a first doping concentration and a lower buried layer 106b with a second doping concentration that is lower than the first doping concentration. For instance, the upper buried layer 106a may have a doping concentration that is greater than $5 \times 10^{18}$ cm$^{-3}$, whereas the lower buried layer 106b may have a doping concentration ranging from $1 \times 10^{16}$ cm$^{-3}$ to $1 \times 10^{17}$ cm$^{-3}$. By adjusting the doping profile within the buried layer 106, the potential gradient across the first PN junction 105 can be reduced to lower the likelihood of having a breakdown. This approach may be less effective where $V_1$ is substantially higher than $V_2$ (e.g., $V_1$-$V_2$≥100 v) and the maximum thickness of the buried layer 106 is limited (e.g., maximum thickness≤12 μm).

Figure 1C:
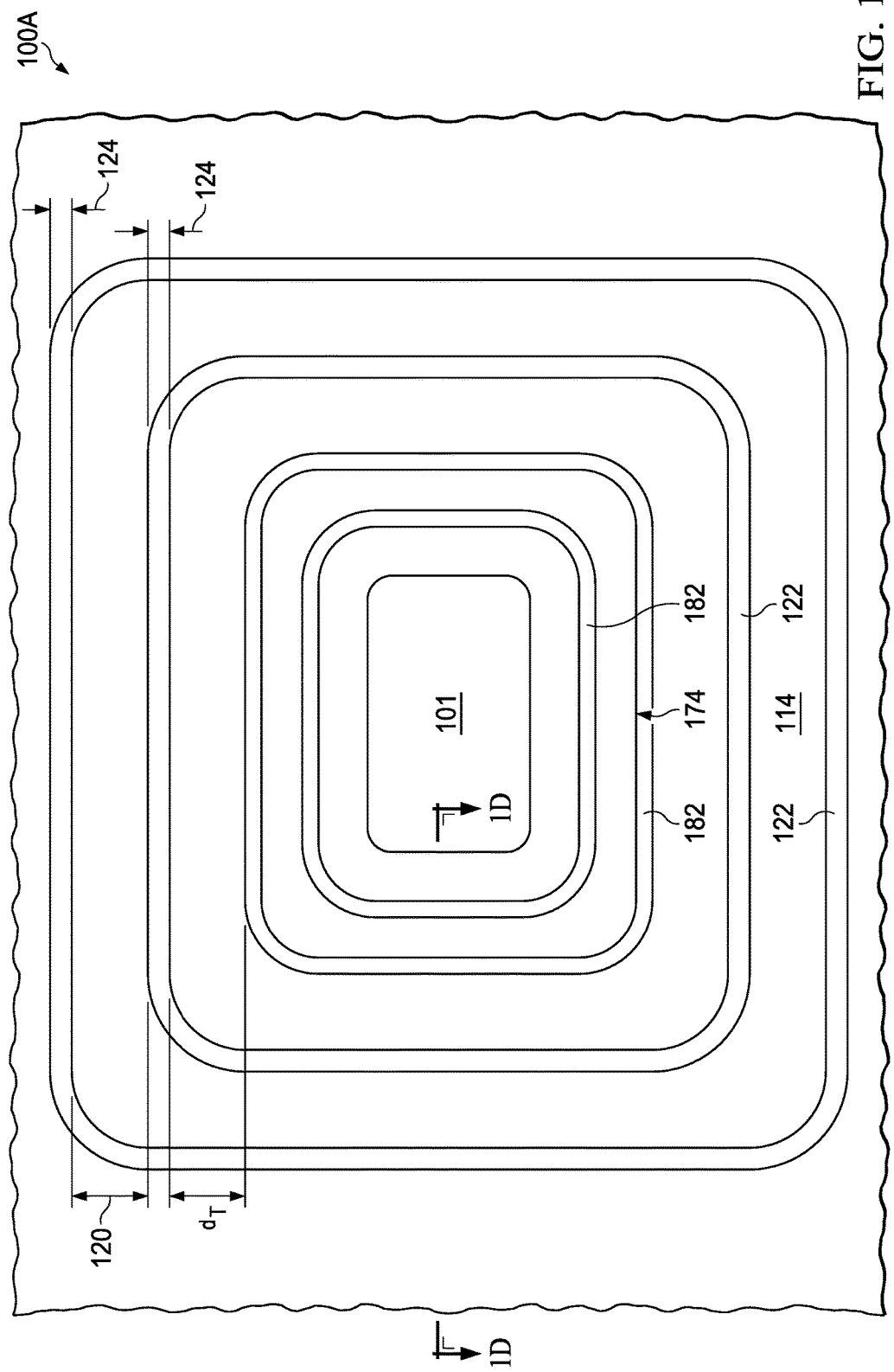
FIG. 1C shows a top view of a semiconductor device with a dual-trench configuration according to an aspect of the present disclosure.
Figure 1D:
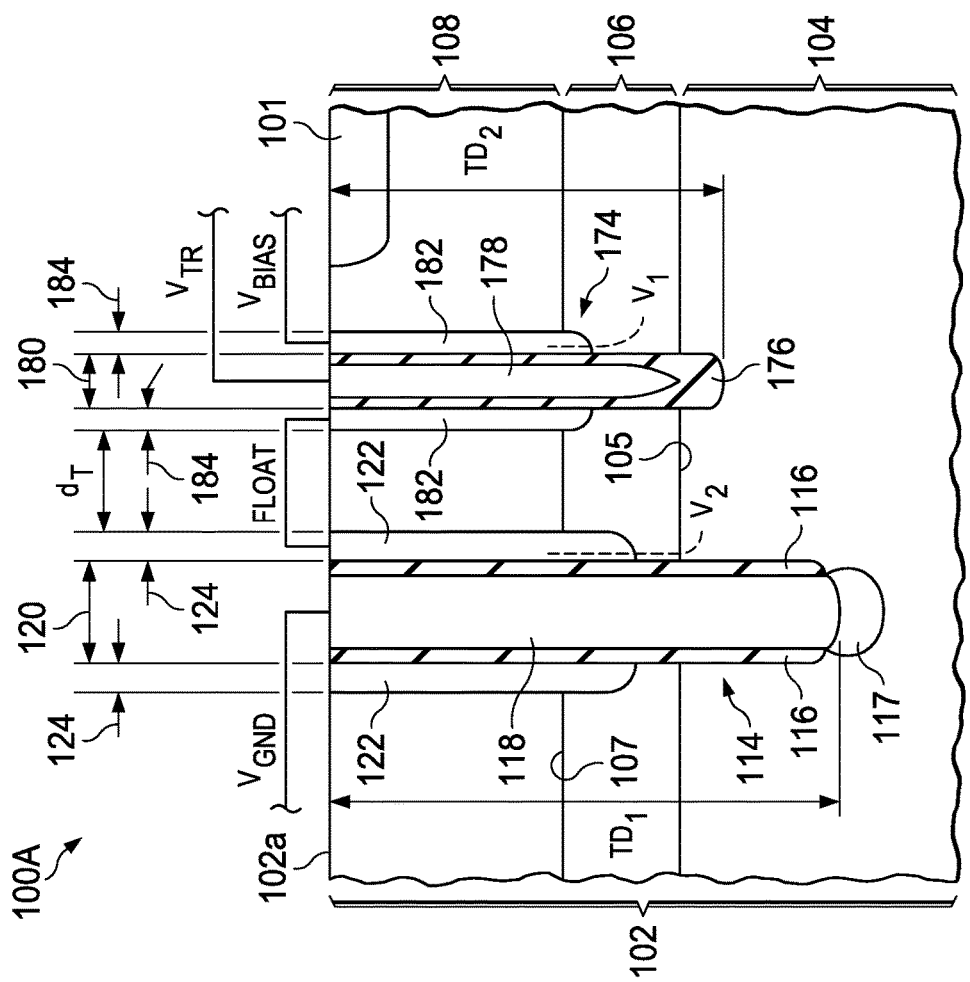
FIG. 1D shows a cross-sectional view of the semiconductor device with the dual-trench configuration according to an aspect of the present disclosure.

To address the above constrains, the present disclosure introduces a dual-trench configuration that alleviates electric field crowding around the first PN junction 105 between the buried layer 106 and the lower semiconductor layer 104 of the substrate 102. FIG. 1C shows a top view of a semiconductor device 100A with a dual-trench configuration, and FIG. 1D shows a cross-sectional view of the semiconductor device 100A according to an aspect of the present disclosure. The semiconductor device 100A is similar to the semiconductor device 100 to the extent that these two devices include components identified with the same numeric labels. The semiconductor device 100A differs from the semiconductor device 100 in that the semiconductor device 100A includes a second deep trench structure 174.

The second deep trench structure 174 is arranged to laterally surround the transistor well region 101 and intersect the buried layer 106. More specifically, the second deep trench structure 174 extends from the top surface 102a to penetrate the buried layer 106. In one implementation, for example, the second deep trench structure 174 may penetrate through the buried layer 106 to reach the lower semiconductor layer 104 of the substrate 102. In another implementation, for example, the second deep trench structure 174 may partially penetrate the buried layer 106 and terminate within the buried layer 106. The second deep trench structure 174 is interposed between the first deep trench structure 114 and the transistor well region 101. As shown in FIG. 1C, the second deep trench structure 174 circumscribes the transistor well region 101, while being circumscribed by the first deep trench structure 114. Together, the dual trenches 114 and 174 establish two contiguous rings for isolating the transistor well region 101. In an alternative implementation, each of the first and second deep trench structures 114 and 174 may be divided into disconnected and discrete segments to approximate a contiguous ring for isolating the transistor well region 101.

To facilitate an efficient etching process and an efficient dielectric filing process, the second deep trench structure 174 may be formed concurrently with the first deep trench structure 114. To that end, the second deep trench structure 174 may have a second trench width (i.e., second trench aperture) 180 that is less than the first trench width (i.e., first trench aperture) 120 of the first deep trench structure 114. In one implementation, for example, the second trench width 180 ranges from 1.5 um to 1.8 um, whereas the first trench width 120 is about (e.g., +/−10% margin) 2.65 um. In another implementation, for example, the second trench width 180 is about (e.g., +/−10% margin) 1.7 um, whereas the first trench width 120 is about (e.g., +/−10% margin) 2.65 um.

Due to the difference in trench widths, the first deep trench structure 114 has a first trench depth $TD_1$ that is greater than a second trench depth $TD_2$ of the second deep trench structure 174 when they are simultaneously etched for the same amount of time. In one implementation, for example, the first trench depth $TD_1$ ranges from 20 um to 28 um, whereas the second trench depth $TD_2$ ranges from 8 um to 16 um. In another implementation, for example, the first trench depth $TD_1$ ranges from 23 um to 27 um, whereas the second trench depth $TD_2$ ranges from 13 um to 15 um. In yet another implementation, for example, the first trench depth $TD_1$ is about (e.g., +/−10% margin) 24 um, whereas the second trench depth $TD_2$ is about (e.g., +/−10% margin) 14 um.

Alternatively, the second deep trench structure 174 may have a second trench width 180 that is substantially the same (e.g., +/−5% margin) as the first trench width 120 of the first deep trench structure 114. Under this particular configuration, the first trench depth $TD_1$ may be substantially the same (e.g., +/−5% margin) as the second trench depth $TD_2$. In one implementation, for example, each of the first and second trench depths $TD_1$ and $TD_2$ ranges from 20 um to 28 um. In another implementation, for example, each of the first and second trench depths $TD_1$ and $TD_2$ ranges from 23 um to 27 um. In yet another implementation, for example, each of the first and second trench depths $TD_1$ and $TD_2$ is about (e.g., +/−10% margin) 24 um.

Similar to the first deep trench structure 114, the second deep trench structure 174 includes dielectric liners 176 disposed along the sidewalls and a bottom portion of thereof. The dielectric liners 176 may include thermal silicon dioxide. The dielectric liner 176 seals off the second deep trench structure 174 to prevent any access to the lower semiconductor layer 104 of the substrate 102. When the second trench width 180 is smaller than the first trench width 120, a simultaneous dielectric formation process may cause the dielectric liners 176 to be slightly sloped and thicker around the bottom portion of the second deep trench structure 174.

The second deep trench structure 174 includes trench fill material 178 disposed onto the dielectric liners 176. The trench fill material 178 is conductive where the second deep trench structure 174 is configured to receive a trench bias voltage $V_{TR}$. Alternatively, the trench fill material 178 may be either conductive or nonconductive where the second deep trench structure 174 is configured to a floating state. In a configuration where the trench fill material 178 is conductive, the trench conductor 178 is insulated from the upper semiconductor layer 108, the buried layer 106, and the lower semiconductor layer 104. In one implementation, for example, the trench fill material 178 includes polycrystalline silicon, which is commonly referred to as polysilicon. Unlike the trench fill conductor 118, the trench fill conductor 178 does not establish any ohmic contact with the lower semiconductor layer 104 of the substrate 102. Rather, the trench fill conductor 178 establishes a capacitive coupling with the buried layer 106 and the lower semiconductor layer 104. Through this capacitive coupling, the trench conductor 178 can be used for influencing the electric field density of the buried layer 106, as well as the lower semiconductor layer 104 of the substrate 102. In one implementation, for example, the trench conductor 178 may be structured to receive a trench bias voltage $V_{TR}$ to reduce the electric field density around the first PN junction 105 between the buried layer 106 and the lower semiconductor layer 104.

Similar to the semiconductor device 100, the semiconductor device 100A includes vertical doped structures (a.k.a. sinkers) 182. The sinkers 182 serve as a conduit for biasing the buried layer 106 to a bias voltage $V_{BIAS}$, thereby establishing a reverse bias between the P-type upper semiconductor layer 108 and the N-type buried layer 106. The sinkers 182 extend from the top surface 102a to reach the buried layer 106. The sinkers 182 are doped with dopants of the same conductivity type as the buried layer 106 so as to provide electrical connections to the buried layer 106. In one implementation, for example, the sinkers 182 are doped with N-type materials where the buried layer 106 is N-doped as well.

For self-alignment purposes, the sinkers 182 may be formed alongside the second deep trench structure 174. The sinkers 182 extend laterally from the second deep trench structure 174 to have a thickness 184, and the sinkers 182 coextend with the second deep trench structure 174 to provide a conductive path between the top surface 102a and the buried layer 106. In one implementation, the thickness 184 of the sinkers may be less than 2.5 microns, which may advantageously reduce the size of the semiconductor device 100 when compared to semiconductor devices without self-alignment sinkers. When the second trench width 180 is less than the first trench width 120, the second sinker thickness 184 may be less than the first sinker thickness 124.

The dual-trench configuration provides several advantages over the single-trench configuration in sustaining a high operation voltage range while preventing breakdowns around an isolation junction. The first advantage includes widening the electric field line distributions between the high electric field line $V_1$ and the low electric field line $V_2$. The widened distribution reduces the potential difference around the first PN junction 105. As shown in FIG. 1D, for example, the high electric field line V1 and the low electric field line V2 are spaced further apart, such that the potential difference across the first PN junction 105 may be substantially reduced.

The widened distribution of electric field lines can be attributed to the structural features of the second deep trench structure 174. In one aspect, by not establishing any ohmic contact with, and thus not biasing, the substrate 102, the second deep trench structure 174 helps sustain a relatively low potential difference across the first PN junction 105 around a region surrounding the second deep trench structure 174. In another aspect, the second deep trench structure 174 helps reduce the potential difference across the first PN junction 105 by having a thicker dielectric liner 178 around the bottom portion thereof. In yet another aspect, the relative positioning of the second deep trench structure 174 helps spread the electric field lines between the biased sinker 182 and the floating sinkers 182' and 122. By virtue of being interposed between the first deep trench structure 114 (which is configured to carry a ground supply voltage $V_{GND}$ (e.g., 0 v)) and the biased region of the buried layer 106 (which is biased at a high bias voltage $V_{BIAS}$ (e.g., 100 v-170 v)), the second deep trench structure 174 serves as a voltage buffer between these two regions.

The inter-trench distance $d_T$ between the first deep trench structure 114 and the second deep trench structure 174 is associated with a breakdown voltage of the first PN junction 105 between the buried layer 106 and the lower semiconductor layer 104 of the substrate 102. Generally, the breakdown voltage is inversely proportional to the inter-trench distance $d_T$. In one implementation, for example, an inter-trench distance $d_T$ of at least 1 um may be sufficient to prevent junction breakdown of the first PN junction 105 where the breakdown voltage of 100 v or lower. In another implementation, for example, an inter-trench distance $d_T$ of about (e.g., +/−10% margin) 1.5 um may be sufficient to prevent junction breakdown of the first PN junction 105 where the breakdown voltage is about (e.g., +/−10% margin) 80v.

The inter-trench distance $d_T$ may also be associated with an electric field density threshold of the first PN junction 105 between the buried layer 106 and the lower semiconductor layer 104 of the substrate 102. Assuming the semiconductor device 100A has an electric field density of 10 v/um, the inter-trench distance $d_T$ is about (e.g., +/−10% margin) 2 um to sustain a 20 v potential difference between the high electric field line $V_1$ and the low electric field line $V_2$. Similarly, assuming the semiconductor device 100A has an electric field density threshold of 20 v/um, the inter-trench distance $d_T$ is about (e.g., +/−10% margin) 1 um to sustain a 20 v potential difference between the high electric field line $V_1$ and the low electric field line $V_2$. Under these assumptions, the inter-trench distance dT is inversely proportional to the electric field density threshold of the first PN junction 105.

The second advantage of the dual-trench configuration includes lowering the a potential spectrum across the high electric field line $V_1$ and the low electric field line $V_2$. In an implementation where the second trench fill material 178 is conductive, the second deep trench structure 174 can be configured to receive a trench bias voltage $V_{TR}$. The trench bias voltage $V_{TR}$ may lower the value of the high electric field line $V_2$ relative to the bias voltage $V_{BIAS}$ as applied to the buried layer 106. In one example, the high electric field line $V_2$ may be reduced to 100 v where the bias voltage $V_{BIAS}$ is set to 140 v and the trench bias voltage $V_{TR}$ is set to 40 v. Similarly, the high electric field line $V_2$ may be reduced to 80 v where the bias voltage $V_{BIAS}$ is set to 140 v and the trench bias voltage $V_{TR}$ is set to 60 v.

To avoid junction breakdowns, the trench bias voltage $V_{TR}$ can be associated with a breakdown voltage of the first PN junction 105 between the buried layer 106 and the lower semiconductor layer 104 of the substrate 102. In one implementation, for example, the trench bias voltage $V_{TR}$ can be set to 40 v where the breakdown voltage is 80 v and the buried layer bias voltage $V_{BIAS}$ is less than 120 v. In another implementation, for example, the trench bias voltage $V_{TR}$ can be set to 60 v where the break down voltage is 60 v and the buried layer bias voltage $V_{BIAS}$ is less than 120 v. Under these examples, the trench bias voltage $V_{TR}$ is inversely proportional to the breakdown voltage of the first PN junction 105 between the buried layer 106 and the lower semiconductor layer 104 of the substrate 102.

And to avoid electric field crowding, the trench bias voltage $V_{TR}$ can also be associate with an electric field density threshold of the first PN junction 105 between the buried layer 106 and the lower semiconductor layer 104 of the substrate 102. Assuming the semiconductor device 100A has an electric field density of 10 v/um and an inter-trench distance $d_T$ of 2 um, the trench bias voltage $V_{TR}$ can be set to 40 v to sustain a 80 v potential difference between the high electric field line $V_1$ and the low electric field line $V_2$ where the buried layer bias voltage $V_{BIAS}$ is at 140 v. Similarly, assuming the semiconductor device 100A has an electric field density of 20 v/um and an inter-trench distance $d_T$ of 2 um, the trench bias voltage $V_{TR}$ can be set to 20 v to sustain a 80 v potential difference between the high electric field line $V_1$ and the low electric field line $V_2$ where the buried layer bias voltage $V_{BIAS}$ is at 140 v. Under these assumptions, the trench bias voltage $V_{TR}$ is inversely proportional to the electric field density threshold of the first PN junction 105.

Figure 2A:
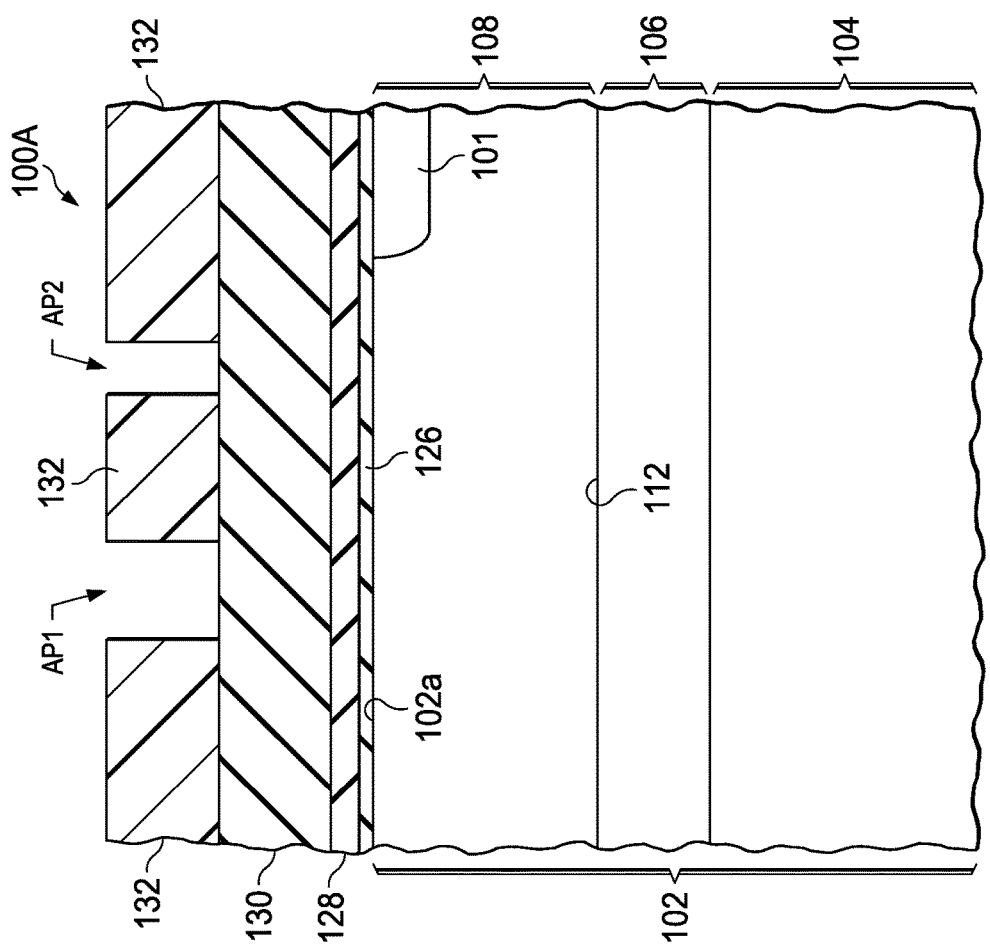
FIGS. 2A-2G show a manufacturing process depicting cross-sectional views of the semiconductor device with the due-trench configuration according to an aspect of the present disclosure.

FIGS. 2A-2G show a manufacturing process depicting cross-sectional views of the semiconductor device 100A with the due-trench configuration according to an aspect of the present disclosure. Referring to FIG. 2A, the buried layer 106 and the upper semiconductor layer 108 are formed on the lower semiconductor layer 104. The buried layer 106 and the upper semiconductor layer 108 may be formed by implanting N-type dopants into the P-type lower semiconductor layer 104, followed by a thermal drive and a subsequent epitaxial process to grow the P-type upper semiconductor layer 108, so that the buried layer 106 is formed by diffusion and activation of the implanted N-type dopants. After the upper semiconductor layer 108 is formed, a transistor well region 101 is formed within the upper semiconductor layer 108 and above the buried layer 106.

A pad oxide layer 126 is formed at the top surface 102a of the substrate 102, for example by thermal oxidation. The pad oxide layer 126 may include 5 nanometers to 30 nanometers of silicon dioxide. A pad nitride layer 128 is formed on the pad oxide layer 126, for example by low pressure chemical vapor deposition (LPCVD) using ammonia and silane. The pad nitride layer 128 may include 100 nanometers to 300 nanometers of silicon nitride. A hard mask oxide layer 130 is formed over the pad nitride layer 128, for example by a plasma enhanced chemical vapor deposition (PECVD) using tetraethyl orthosilicate, which is also known as tetraethoxysilane (TEOS), or using a high density plasma (HDP) process. The hard mask oxide layer 130 may include 500 nanometers to 2 microns of silicon dioxide. The pad nitride layer 128 provides an etch stop layer for subsequent etching of the hard mask oxide layer 130.

A trench mask 132 is formed over the hard mask oxide layer 130 so as to expose areas for forming the first deep trench structure 114 and the second deep trench structure 174 as shown and described in FIGS. 1C and 1D. More specifically, the trench mask 132 is patterned with a first aperture AP1 and a second aperture AP2. The first aperture AP1 defines the first trench width 120, whereas the second aperture AP2 defines the second trench width 180. Accordingly, the first aperture AP1 is generally bigger than the second aperture AP2. In one implementation, for example, the second aperture AP2 ranges from 1.5 um to 1.8 um, whereas the first aperture AP1 is about (e.g., +/−10% margin) 2.65 um. In another implementation, for example, the second aperture AP2 is about (e.g., +/−10% margin) 1.7 um, whereas the first aperture AP1 is about (e.g., +/−10% margin) 2.65 um. The trench mask 132 may include a photoresist material formed by a photolithographic process, and may further include a hard mask layer and/or an anti-reflection layer.

Figure 2B:
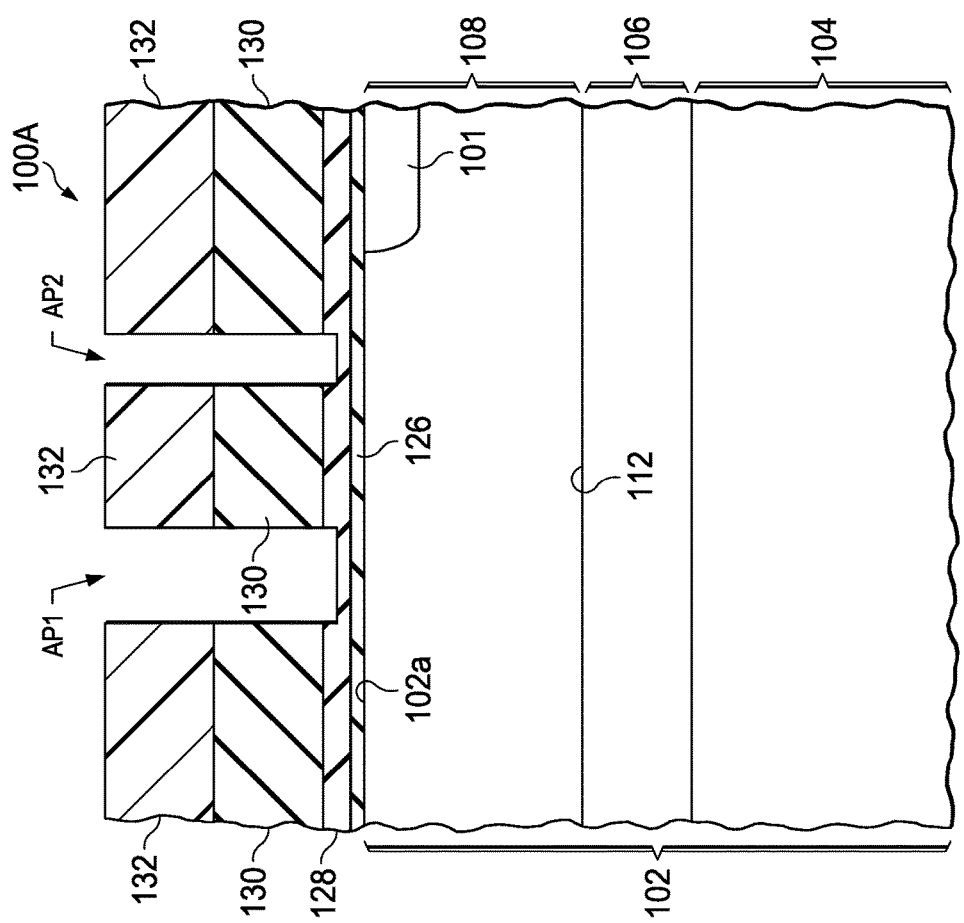

Referring to FIG. 2B, a hard mask etch process removes material from the hard mask oxide layer 130 in the areas exposed by the trench mask 132. The hard mask etch process may include a reactive ion etch (RIE) process using fluorine radicals, and/or may include a wet etch process using a dilute buffered aqueous solution of hydrofluoric acid. A portion of the pad nitride layer 128 may be removed by the hard mask etch process, as depicted in FIG. 2B. A portion or all of the trench mask 132 may be eroded by the hard mask etch process.

Figure 2C:
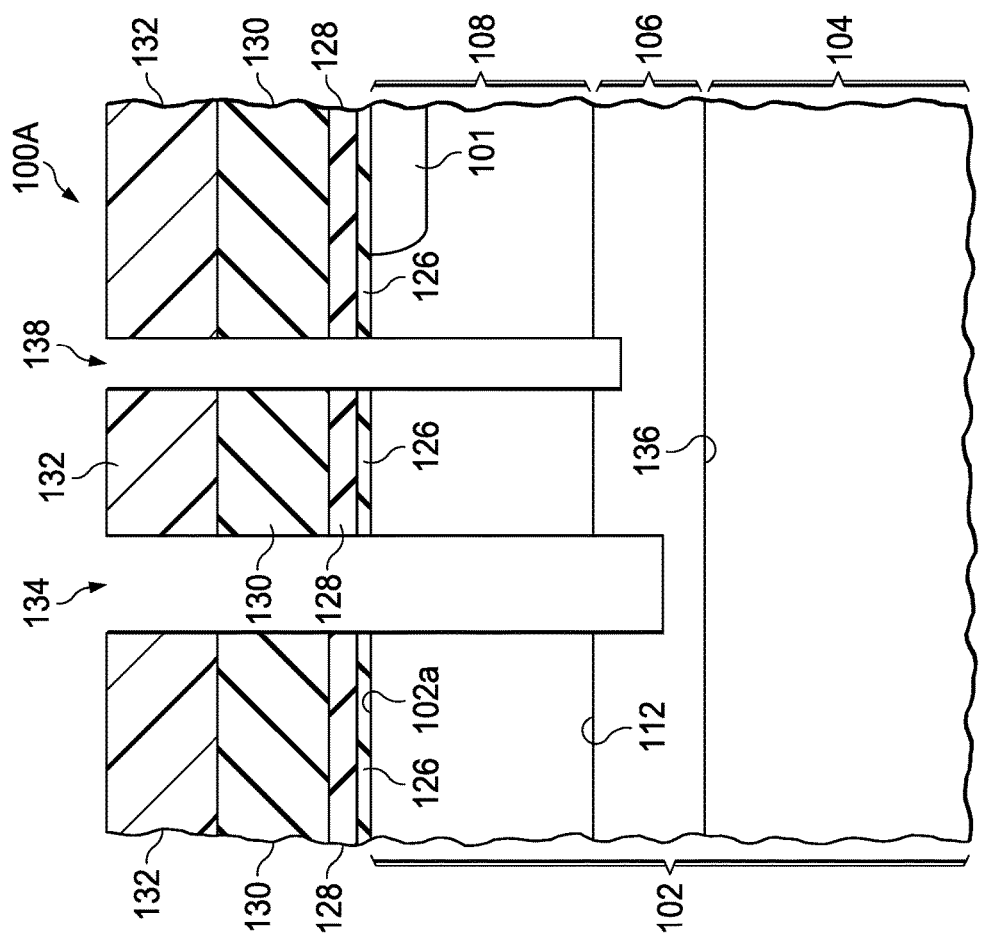

Referring to FIG. 2C, a stop layer etch process removes the pad nitride layer 128 and the pad oxide layer 126 in the areas exposed by the trench mask 132. The stop layer etch process may include an RIE process with a different combination of gases from the hard mask etch process discussed in reference to FIG. 2B. The trench mask 132 may be further eroded by the stop layer etch process.

The stop layer etch includes a first trench etch process removing material from the substrate 102 in the areas exposed by the trench mask 132 to simultaneously form a first partial deep trench 134 and a second partial deep trench 138. The first partial deep trench 134 extends to the buried layer 106 deeper than the second partial deep trench 138 given the first aperture AP1 is wider than the second aperture AP2. The first trench etch process may include a continuous etch process which simultaneously removes material from the bottoms of the first and second partial deep trenches 134 and 138, as well as passivates sidewalls of the first and second partial deep trenches 134 and 138. Alternatively, the first deep trench etch process may include a two-step process. During the first step, the first deep trench etch process removes material from the bottoms of the first and second partial deep trenches 134 and 138. During the second step, the first deep trench etch process removes passivates sidewalls of the first and second partial deep trenches 134 and 138. The trench mask 132 may be further eroded by the first trench etch process.

Figure 2D:
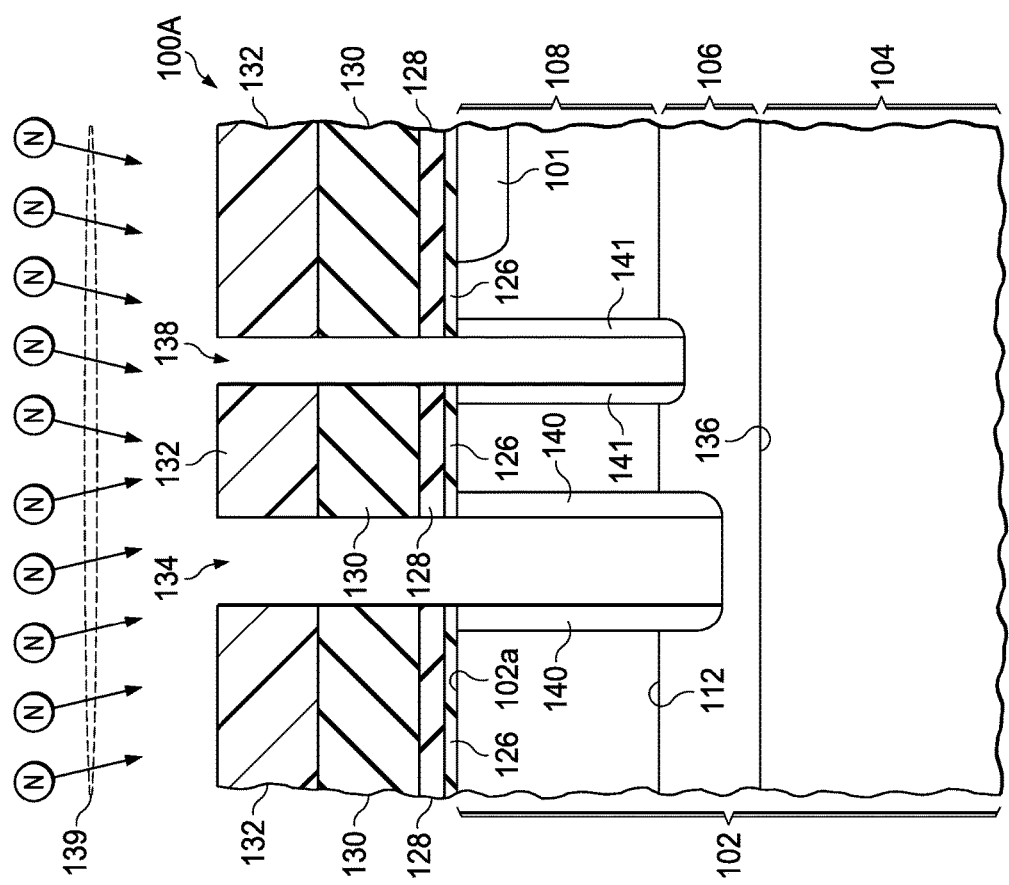

Referring to FIG. 2D, N-type dopants 139 are implanted into the substrate 102 along the sidewalls of the first partial deep trench 134 to form the first N-type sinker implanted layers 140 and along the sidewalls of the second partial deep trench 138 to form the second N-type sinker implanted layers 141. The N-type dopants 139 may be implanted in multiple sub-doses at tilt angles. In one implementation, for example, the tilt angles range from 10 degrees to 30 degrees to provide continuous coverage of the first and second sinker implanted layers 140 and 141 along the respective sidewalls of the first and second partial deep trenches 134 and 138.

The N-type dopants 139 may also be implanted at twist angles of about 45 degrees to reduce the amount of the N-type dopants 139 implanted into bottom surfaces of the first and second partial deep trenches 134 and 138. An example implant process may include four sub-doses rotated at 90 degrees apart, at tilt angles of 10 degrees to 30 degrees, and at twist angles of 45 degrees. Reducing the amount of the N-type dopants 139 implanted into bottom surfaces of the first and second partial deep trench 134 and 138 may advantageously improve the process margin of a second trench etch process subsequent to the first trench etch process.

The N-type dopants 139 may be implanted at a total dose of $1 \times 10^{14}$ cm$^{-2}$ to $2 \times 10^{15}$ cm$^{-2}$ so as to provide desirably low resistance of the subsequent formed sinkers. The N-type dopants 139 may include phosphorus and/or arsenic. A pad oxide layer (not shown) may be formed on the sidewalls of the first and second partial deep trenches 134 and 138. If N-type dopants 139 include arsenic, a pad oxide layer of 30 nanometers of silicon dioxide formed by a PECVD process using TEOS may improve retention of the implanted arsenic in the first and second sinker implanted layers 140 and 141. Alternatively, if the N-type dopants 139 do not include arsenic, a pad oxide on the sidewalls of the first and second partial deep trench 134 and 138 may be omitted because the pad oxide may increases stress in the substrate 102, which may lead to degrading performance of the semiconductor device 100A.

Implanting the n-type dopants 139 after forming the first and second partial deep trenches 134 and 138 and before forming full deeper trenches therefrom may advantageously prevent the first and second sinker implanted layers 140 and 141 from extending beyond the buried layer 106. Such a process may also improve a breakdown voltage of the PN junctions in the semiconductor device 100A. Moreover, the first and second partial deep trenches 134 and 138 serve as a self-alignment means for forming the first and second sinker implanted layers 140 and 141, such that no additional mask is required. Because the first aperture AP1 is wider than the second aperture AP2, the first sinker implanted layer 140 has a greater lateral thickness than the second sinker implanted layer 141.

Figure 2E:
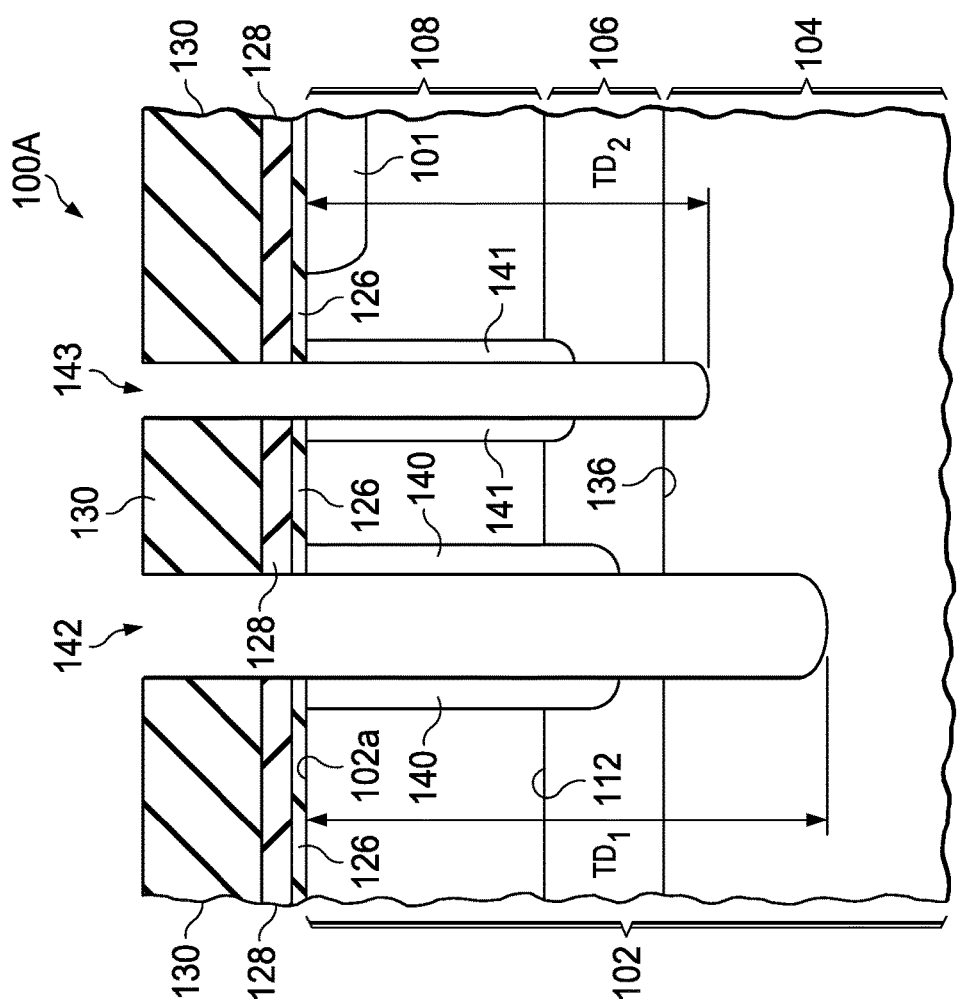

Referring to FIG. 2E, a second trench etch process is performed to remove additional material from the substrate 102 so as to further extend the first and second partial deep trenches 134 and 138 to simultaneously form a first and second full deep trenches 142 and 143 respectively. Because the first aperture AP1 is wider than the second aperture AP2, the first full trench 142 has a first trench depth $TD_1$ greater than a second trench depth $TD_2$ of the second full trench 143. In one implementation, for example, the first full trench 142 extends below the buried layer 106 by at least 17 um whereas the second full trench 142 extends below the buried layer 106 by less than 17 um. In another implementation, for example, the first full trench 142 extends below the buried layer 106 whereas the second full trench 142 does not extend below the buried layer 106. Upon the completion of the second trench etch process, substantially all of the remaining trench mask 132.

Figure 2F:
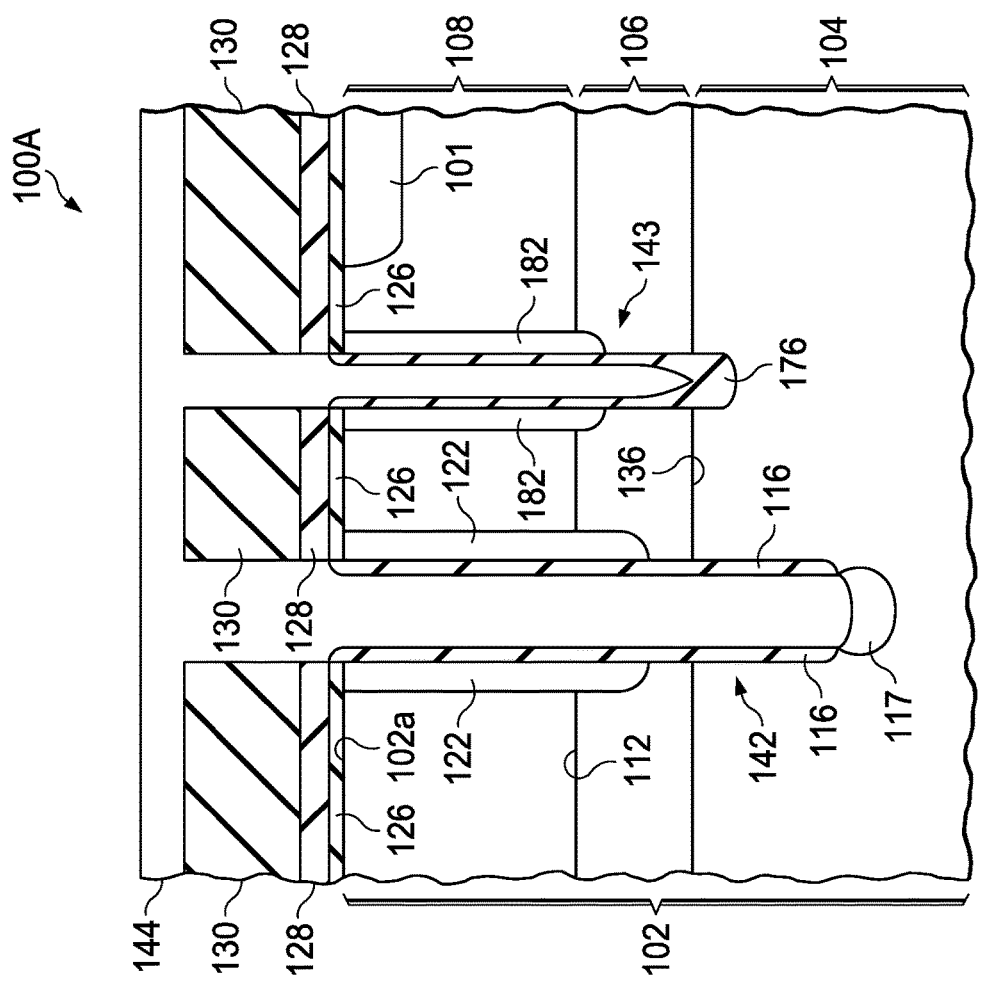

Referring to FIG. 2F, a dielectric deposition process is performed to form first and second dielectric liners 116 and 176 on the sides and bottoms of the first and second full deep trenches 142 and 143 respectively. In one implementation, for example, the dielectric liners 116 and 176 may each have a thickness ranges from 100 nanometers to 800 nanometers. In another implementation, for example, the first and second dielectric liners 116 and 176 may include a thermal oxide layer having a thickness ranges from 200 nanometers to 300 nanometers on the sides and bottoms of the first and second full deep trenches 142 and 143. In yet another implementation, for example, a silicon dioxide layer having a thickness ranges from 300 nanometers to 500 nanometers may be formed on the thermal oxide by a sub-atmospheric chemical vapor deposition (SACVD) process.

Because the first deep full trench 142 has a greater trench width than the second full deep trench 143, the second dielectric layer 176 forms a pinch off section 177 around the bottom portion of the second full deep trench 143, while the first dielectric layer 116 forms a relatively uniform thickness around the bottom portion of the first full deep trench 142. In general, the pinch off section 177 in the second full deep trench 142 is thicker than the first dielectric layer 116 around the bottom portion of the first full deep trench 142.

Next, an oxide etch process is performed to create a bottom opening within the first full deep trench 142 for accessing the lower semiconductor layer 104. Because of the thicker pinch off section 177, the bottom portion of the second full deep trench 143 remains closed to the lower semiconductor layer 104 after the oxide etch process is completed. Upon creating the bottom opening within the first full deep trench 142, a P-type doping process may be performed to create a contact doped region 117 directly under the bottom opening.

Then, a layer of trench fill material 144 is formed in the first and second full deep trenches 142 and 143 on the first and second dielectric liners 116 and 176. In one implementation, for example, the layer of trench fill material 144 may include a polysilicon material that fills in the first and second full deep trenches 142 and 143, as well as covering the hard mask oxide layer 130. Alternatively, the layer of trench fill material 144 may include silicon dioxide or other dielectric material for filling the second full deep trench 143 where the second deep trench 174 is configured to a floating state.

Thermal profiles during formation of the first and second dielectric liners 116 and 176, as well as and the trench fill material 144, cause the implanted N-type dopants in the first and second sinker implanted layers 140 and 141 to diffuse and become activated. Advantageously, the first and second sinkers 122 and 182 are formed without requiring a separate annealing process.

Figure 2G:
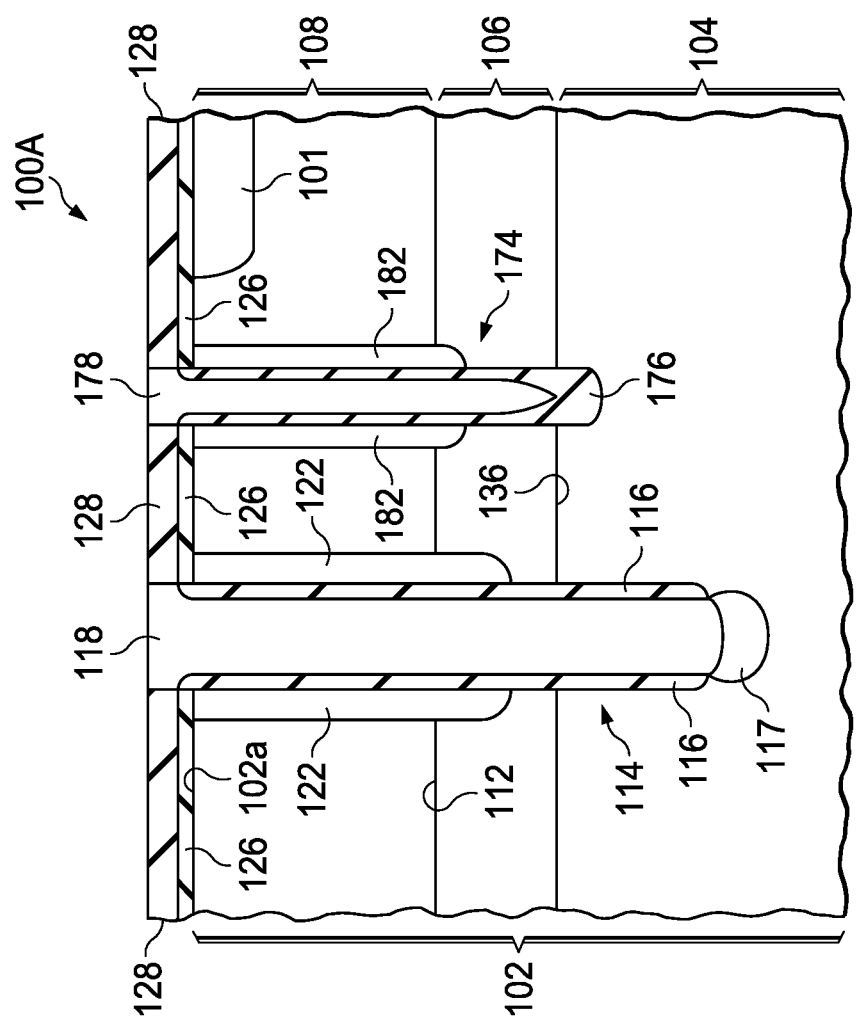

Referring to FIG. 2G, the hard mask oxide layer 130 and the overlying portion of the layer of trench fill material 144 are subsequently removed, for example, by a chemical mechanical polish (CMP) process. As a result, the first trench fill material 118 is left in the first deep trench structure 114, while the second trench fill material 178 is left in the second deep trench structure 174. The pad nitride layer 128 serves as an etch stop layer for removal of the hard mask oxide layer 130. The pad nitride layer 128 and the pad oxide layer 126 are subsequently removed, to result in the structure as shown in FIGS. 1C and 1D.

Consistent with the present disclosure, the terms "substantially equal to," "substantially equal," "substantially the same," and the variations thereof, as applied to features of an integrated circuit, is understood to mean equal within fabrication tolerances used to form the integrated circuit. More specifically, the terms "substantially equal to" and "substantially equals" purport to describe a quantitative relationship between two objects. This quantitative relationship may prefer the two objects to be equal by design but with the anticipation that a certain amount of variations can be introduced by the fabrication process. In one aspect, a first resistor may have a first resistance that is substantially equal to a second resistance of the second resistor where the first and second resistors are purported to have the same resistance yet the fabrication process introduces slight variations between the first resistance and the second resistance. Thus, the first resistance can be substantially equal to the second resistance even when the fabricated first and second resistors demonstrate slight difference in resistance. This slight difference may be within 5% of the design target. In another aspect, a first resistor may have a first resistance that is substantially equal to a second resistance of a second resistor where the process variations are known a priori, such that the first resistance and the second resistance can be preset at slightly different values to account for the known process variations. Thus, the first resistance can be substantially equal to the second resistance even when the design values of the first and second resistance are preset to include a slight difference to account for the known process variations. This slight difference may be within 5% of the design target.

Consistent with the present disclosure, the term "configured to" purports to describe the structural and functional characteristics of one or more tangible non-transitory components. For example, the term "configured to" can be understood as having a particular configuration that is designed or dedicated for performing a certain function.

Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

Moreover, the term "exemplary" is used herein to mean serving as an example, instance, illustration, etc., and not necessarily as advantageous. Also, although the disclosure has been shown and described with respect to one or more implementations, equivalent alterations and modifications will be apparent upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, simultaneous processing may be advantageous for fabricating multiple structures of a semiconductor device. Moreover, the separation of various system components in the embodiments described above should not be understood as requiring such separation in all embodiments.

What is claimed is:

1. An integrated circuit, comprising:
   a substrate having a top surface and a bottom surface;
   a buried layer positioned within the substrate;
   a transistor well region positioned above the buried layer;
   a first trench extending from the top surface to penetrate the buried layer, the first trench having a first trench depth; and
   a second trench extending from the top surface to penetrate the buried layer, the second trench interposed between the first trench and the transistor well region, and having a second trench depth less than the first trench depth,
   wherein:
   the first trench includes a first conductor insulated from the buried layer and making an ohmic contact with the substrate around a bottom portion of the first trench; and
   the second trench includes a second conductor insulated from the buried layer and the substrate.

2. The integrated circuit of claim 1, wherein the dielectric liner insulates the conductor to a floating state.

3. The integrated circuit of claim 1, wherein the second trench includes a conductor structured to receive a bias voltage associated with a breakdown voltage of a junction between the buried layer and the substrate.

4. The integrated circuit of claim 1, wherein the second trench includes a conductor structured to receive a bias voltage associated with an electric field density threshold of a junction between the buried layer and the substrate.

5. The integrated circuit of claim 1, wherein the first trench is spaced apart from the second trench by a distance associated with a breakdown voltage of a junction between the buried layer and the substrate.

6. The integrated circuit of claim 1, wherein the first trench is spaced apart from the second trench by a distance associated with an electric field density threshold of a junction between the buried layer and the substrate.

7. The integrated circuit of claim 1, wherein the first trench is spaced apart from the second trench by a distance greater than 1 um.

8. The integrated circuit of claim 1, wherein the first trench has a first aperture defined at the top surface, and the second trench has a second aperture defined at the top surface and smaller than the first aperture.

9. The integrated circuit of claim 1, further comprising:
   a high voltage circuit developed outside of the transistor well region; and
   a low voltage circuit developed within of the transistor well region and shield from the high voltage circuit by the first trench and the second trench.

10. An integrated circuit, comprising:
    a substrate having a first conductivity type, a top surface, and a bottom surface;
    a buried layer having a second conductivity type opposite of the first conductivity type, the buried layer positioned in the substrate;
    a transistor well region positioned above the buried layer;
    a first trench extending from the top surface to penetrate the buried layer, the first trench having: a first trench depth, and a first conductor insulated from the buried layer and making an ohmic contact with the substrate around a bottom portion of the first trench; and
    a second trench extending from the top surface to penetrate the buried layer, the second trench interposed between the first trench and the transistor well region, and having: a second trench depth less than the first trench depth, and a second conductor insulated from the buried layer and the substrate.

11. The integrated circuit of claim 10, wherein the second conductor is insulated to a floating state.

12. The integrated circuit of claim 10, wherein the second conductor is structured to receive a bias voltage associated with a breakdown voltage of a junction between the buried layer and the substrate.

13. The integrated circuit of claim 10, wherein the second conductor is structured to receive a bias voltage associated with an electric field density threshold of a junction between the buried layer and the substrate.

14. The integrated circuit of claim 10, wherein the first trench is spaced apart from the second trench by a distance associated with a breakdown voltage of a junction between the buried layer and the substrate.

15. The integrated circuit of claim 10, wherein the first trench is spaced apart from the second trench by a distance associated with an electric field density threshold of a junction between the buried layer and the substrate.

16. A method, comprising:
   forming a buried layer within a substrate;
   forming a transistor well region above the buried layer;
   forming a first trench extending from a top surface of the substrate to penetrate the buried layer, the first trench having a first trench depth;
   forming a second trench extending from the top surface of the substrate to penetrate the buried layer, the second trench interposed between the first trench and the transistor well region, and having a second trench depth less than the first trench depth;
   forming a first conductor within the first trench, the first conductor insulated from the buried layer and making an ohmic contact with the substrate around a bottom portion of the first trench; and
   forming a second conductor within the second trench, the second conductor insulated from the buried layer and the substrate.

17. The method of claim 16, further comprising:
insulating the second conductor to a floating state.

18. The method of claim 16, further comprising:
forming a conductor within the second trench;
   forming a contact with the conductor for receiving a bias voltage associated with a breakdown voltage of a junction between the buried layer and the substrate.

19. The method of claim 16, wherein the first trench is spaced apart from the second trench by a distance associated with a breakdown voltage of a junction between the buried layer and the substrate.

20. The method of claim 16, wherein the first trench is spaced apart from the second trench by a distance associated with an electric field density threshold of a junction between the buried layer and the substrate.

21. The method of claim 16, wherein the first trench is spaced apart from the second trench by a distance greater than 1.5 um.

22. The method of claim 16, wherein:
   the forming the first trench includes:
      defining a first aperture at the top surface of the substrate; and
      etching a top layer of the substrate, the buried layer, and a bottom layer of the substrate for a predetermined time period through the first aperture; and
   the forming the second trench includes:
      defining a second aperture at the top surface of the substrate, the second aperture smaller than the first aperture; and
   etching the top layer of the substrate, the buried layer, and the bottom layer of the substrate for the predetermined time period through the second aperture.

23. The method of claim 16, further comprising:
   forming a high voltage circuit outside of the transistor well region; and
   forming a low voltage circuit within of the transistor well region and shielded from the high voltage circuit by the first trench and the second trench.

* * * * *